(12) United States Patent
Yoshida et al.

(10) Patent No.: US 10,205,250 B2
(45) Date of Patent: Feb. 12, 2019

(54) JUNCTION STRUCTURE FOR AN ELECTRONIC DEVICE AND ELECTRONIC DEVICE

(71) Applicant: TDK CORPORATION, Tokyo (JP)

(72) Inventors: Kenichi Yoshida, Tokyo (JP); Yuhei Horikawa, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 859 days.

(21) Appl. No.: 14/219,766

(22) Filed: Mar. 19, 2014

(65) Prior Publication Data

US 2014/0291021 A1 Oct. 2, 2014

(30) Foreign Application Priority Data

Mar. 28, 2013 (JP) .................................. 2013-069879

(51) Int. Cl.
*B32B 15/01* (2006.01)
*H01R 4/02* (2006.01)
(Continued)

(52) U.S. Cl.
CPC ............... *H01R 4/02* (2013.01); *B23K 35/00* (2013.01); *H01L 24/13* (2013.01); *H01L 24/16* (2013.01); *H01L 24/81* (2013.01); *H05K 3/3463* (2013.01); *H05K 3/4007* (2013.01); *H01L 2224/0345* (2013.01); *H01L 2224/0346* (2013.01); *H01L 2224/03452* (2013.01); *H01L 2224/0401* (2013.01); *H01L 2224/05568* (2013.01); *H01L 2224/05666* (2013.01); *H01L 2224/05671* (2013.01); *H01L 2224/1145* (2013.01); *H01L 2224/11452* (2013.01); *H01L 2224/11462* (2013.01); *H01L 2224/11464* (2013.01); *H01L 2224/13023* (2013.01); *H01L 2224/13083* (2013.01); *H01L 2224/13111* (2013.01); *H01L 2224/13144* (2013.01);
(Continued)

(58) Field of Classification Search
CPC .................................. B32B 15/01; H01R 4/02
USPC ................................................ 428/672, 680
See application file for complete search history.

(56) References Cited

U.S. PATENT DOCUMENTS 4,842,961 A * 6/1989 Basile ................... B32B 15/013
174/546
6,342,442 B1 * 1/2002 Angst .................. B23K 1/0016
438/612
(Continued)

FOREIGN PATENT DOCUMENTS

JP      A-63-3425      1/1988
JP      A-11-217276    8/1999
(Continued)

OTHER PUBLICATIONS

English Machine Translation of Nagano (JP 2001-110922), EPO, accessed Apr. 14, 2016.*

*Primary Examiner* — Humera N Sheikh
*Assistant Examiner* — Xiaobei Wang
(74) *Attorney, Agent, or Firm* — Oliff PLC

(57) ABSTRACT

A junction structure for electronic device having an excellent bonding strength is provided. A junction structure for electronic device in accordance with one aspect of the present invention includes a first metal layer containing nickel and a second metal layer containing gold, tin, and nickel, while the second metal layer includes an AuSn eutectic phase.

11 Claims, 8 Drawing Sheets

(51) Int. Cl.
  *B23K 35/00* (2006.01)
  *H05K 3/34* (2006.01)
  *H05K 3/40* (2006.01)
  *H01L 23/00* (2006.01)

(52) U.S. Cl.
  CPC ........ *H01L 2224/13155* (2013.01); *H01L 2224/13166* (2013.01); *H01L 2224/13171* (2013.01); *H01L 2224/16238* (2013.01); *H01L 2224/16502* (2013.01); *H01L 2224/8121* (2013.01); *H01L 2224/81193* (2013.01); *H01L 2224/81805* (2013.01); *H01L 2224/81825* (2013.01); *H01L 2924/01322* (2013.01); *H05K 2201/0367* (2013.01)

(56) References Cited

U.S. PATENT DOCUMENTS

| | | | |
|---|---|---|---|
| 7,114,644 B2 | 10/2006 | Miyazaki | |
| 2005/0266251 A1* | 12/2005 | Rita | B32B 15/04 428/432 |
| 2010/0104887 A1* | 4/2010 | Yamamoto | H01L 23/04 428/576 |
| 2010/0127046 A1* | 5/2010 | Mehrotra | H01L 23/3735 228/122.1 |
| 2010/0326713 A1* | 12/2010 | Barthelmes | C23C 18/44 174/257 |

FOREIGN PATENT DOCUMENTS

| | | |
|---|---|---|
| JP | A-2001-110922 | 4/2001 |
| JP | A-2005-262317 | 9/2005 |

\* cited by examiner

JUNCTION STRUCTURE FOR AN ELECTRONIC DEVICE AND ELECTRONIC DEVICE

BACKGROUND OF THE INVENTION

Field of the Invention

The present invention relates to a junction structure for an electronic device and an electronic device equipped with the junction structure.

Related Background Art

A method for joining members constituting an electronic device to each other through an AuSn-based braze material has been known (see, for example, Patent Literature 1). The braze material means an alloy having a melting point lower than that of members (substrates, conductor layers, and the like) to be joined. For joining with the AuSn-based braze material, an Au plating layer is formed beforehand on each of surfaces of a pair of members to be joined together. Then, the AuSn-based braze material held between a pair of Au plating layers is melted by heating, so as to form a junction structure between the members, whereby the members are electrically connected to each other by the junction structure. In this joining method, the Au plating layers improve the wettability of the AuSn-based braze material to the surfaces of the members.

Patent Literature 1: Japanese Patent Application Laid-Open No. 2005-262317

SUMMARY OF THE INVENTION

In a joining method using the conventional AuSn-based braze material, voids or cracks are likely to occur at an interface (junction interface) between an AuSn layer formed from the AuSn-based braze material and its adjacent Au layer (a layer derived from the Au plating layer). Junction structures having voids or cracks formed in their junction interfaces are likely to be damaged at the junction interfaces by a shearing force exerted thereon. That is, the conventional junction structures formed by using the AuSn-based braze material are hard to achieve a sufficient bonding strength between the members. Therefore, when an impact of falling or the like is exerted on an electronic device equipped with a conventional junction structure, the junction structure may fail easily, thereby breaking the electric connection between the members.

In view of the foregoing circumstances, it is an object of the present invention to provide a junction structure for an electronic device having an excellent bonding strength and an electronic device equipped with the junction structure.

A junction structure for an electronic device (junction structure body) in accordance with one aspect of the present invention comprises a first metal layer containing nickel (Ni) and a second metal layer, formed on the first metal layer, containing gold (Au), tin (Sn), and nickel (Ni), while the second metal layer includes an AuSn eutectic phase.

In the junction structure for an electronic device in accordance with one aspect of the present invention, an AuSnNi alloy phase may exist in a part of the second metal layer located on the first metal layer side.

In the junction structure for an electronic device in accordance with one aspect of the present invention, the AuSn eutectic phase may exist in a part of the second metal layer located on a side opposite from the first metal layer.

In the junction structure for an electronic device in accordance with one aspect of the present invention, nickel may be distributed unevenly in the AuSn eutectic phase.

In the junction structure for an electronic device in accordance with one aspect of the present invention, Sn may be distributed lopsidedly about nickel unevenly distributed in the AuSn eutectic phase.

In the mode mentioned above, the part of the second metal layer located on the first metal layer side may be an AuSnNi alloy layer including the AuSnNi alloy phase, while the nickel concentration in the AuSnNi alloy layer may decrease with distance from the first metal layer.

In the junction structure for an electronic device in accordance with one aspect of the present invention, the nickel concentration in the first metal layer may decrease as the distance from the second metal layer decreases.

The electronic device in accordance with one aspect of the present invention comprises the above-mentioned junction structure (junction structure body).

The present invention provides a junction structure for an electronic device having an excellent bonding strength and an electronic device equipped with the junction structure.

BRIEF DESCRIPTION OF THE DRAWINGS

FIG. 7(a) is a photograph of a cross section of the junction structure of Example 5 taken by the SEM, while

DESCRIPTION OF THE PREFERRED EMBODIMENTS

Figure 1:
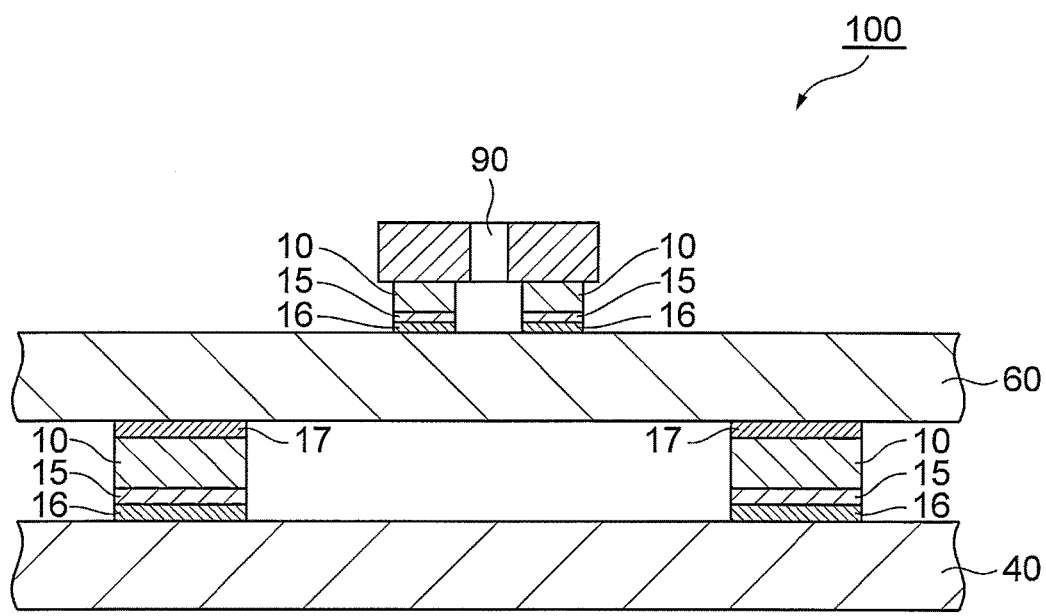
FIG. 1 is a schematic view illustrating a cross section of an embodiment of the electronic device in accordance with the present invention.
Figure 2:
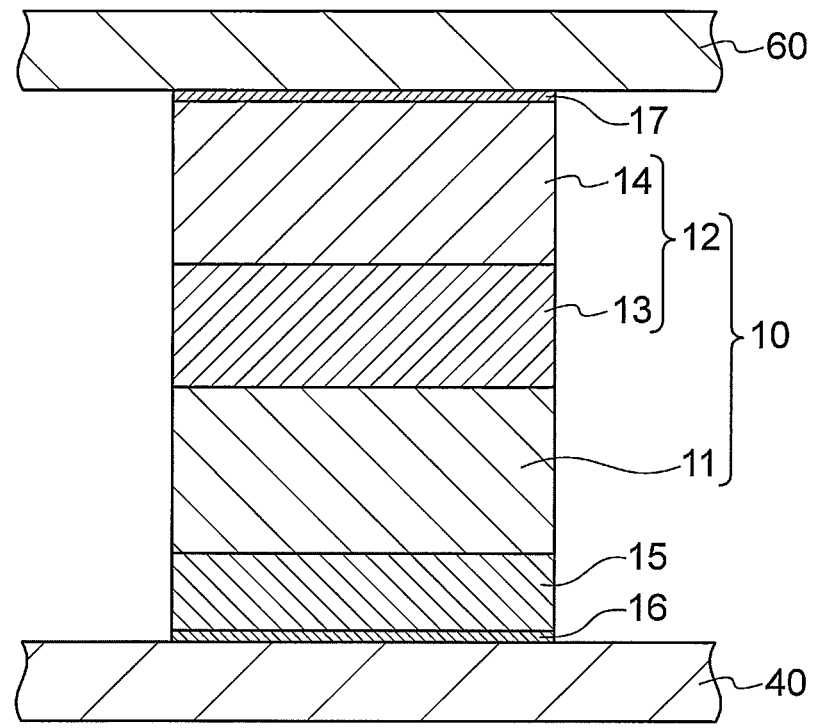
FIG. 2 is a schematic view illustrating a cross section of an embodiment of the junction structure in accordance with the present invention.

In the following, preferred embodiments of the present invention will be explained with reference to drawings when necessary. However, the present invention is not limited to the following embodiments. In the drawings, the same or equivalent constituents will be referred to with the same signs while omitting their overlapping descriptions. FIGS. 1 to 3 are merely schematic views, while forms and aspect ratios of junction structures and electronic devices are not limited to those illustrated in FIGS. 1 to 3.

Junction Structure and Electronic Device

FIG. 1 is a cross section of an electronic device 100 (module) of an embodiment. Here, the cross section is one taken along a direction perpendicular to surfaces of first and second substrates 40, 60 (a direction in which the substrates oppose each other). The electronic device 100 of this embodiment may comprise the first substrate 40, the second substrate 60, a chip 90, and junction structures 10. Some junction structures 10 are placed between the first and second substrates 40, 60 and join the first and second substrates 40, 60 to each other, so as to connect them electrically. The other junction structures 10 are placed between the second substrate 60 and the chip 90 and join the second substrate 60 and the chip 90 to each other, so as to connect them electrically. The electronic device 100 may comprise a pair of electronic components (e.g., semiconductor elements) joined to each other by the junction structure 10.

The first and second substrates 40, 60 may be substrates constituted by inorganic substances such as Si and ceramics. The first and second substrates 40, 60 may also be substrates (e.g., motherboards) constituted by organic substances such as resins. The first and second substrates 40, 60 may be composed of inorganic substances having a melting point higher than a heating temperature required for forming the junction structures 10. This is because the first and second substrates 40, 60 composed of the inorganic substances having the higher melting point are harder to be melted and damaged by the heating required for forming the junction structures 10. The chip 90 may be an electronic component such as a semiconductor element.

FIG. 2 is a cross section of the junction structure 10 for an electronic device in accordance with this embodiment. Here, the cross section is one taken along a direction perpendicular to surfaces of first and second substrates 40, 60 (a direction in which the substrates oppose each other). A conductor layer 15 is formed on the first substrate 40. The junction structure 10 comprises a first metal layer 11 mounted on the conductor layer 15 and a second metal layer 12 mounted on the first metal layer 11. The first metal layer 11 contains nickel. The second metal layer 12 contains gold, tin, and nickel. The second metal layer 12 further includes an AuSn eutectic phase. Here, the eutectic means a mixture of two or more kinds of alloys which crystallize at the same time when two or more kinds of molten metals are cooled. A part of the AuSn eutectic phase may contain nickel in addition to gold and tin. Though the conductor layer 15 is not essential for the junction structure 10, providing the conductor layer 15 composed of a substance excellent in electrical conductivity such as gold, silver, copper, or aluminum enhances the electrical conductivity between the first and second substrates 40, 60. Seed layers 16, 17 composed of titanium or the like may be disposed between the conductor layer 15 and the respective substrates. The seed layers 16, 17 improve the adhesion between the conductor layer 15 and the respective substrates.

The first and second metal layers 11, 12 have a continuous composition in that they contain nickel, while the second metal layer 12 includes an AuSn eutectic phase. Therefore, any shearing force acting on the junction structure 10 in a direction substantially parallel to the surface of the first or second substrate 20, 60 is inhibited from damaging the interface on the second substrate 60 side of the second metal layer 12 and the interface between the first and second metal layers 11, 12. This makes the junction structure 10 of this embodiment superior to the conventional junction structures in terms of bonding strength. In other words, the junction structure 10 of this embodiment is excellent in durability against shearing forces. Hence, even when an impact (e.g., of falling) is exerted on the electronic device 100, the junction structure 10 is hard to fail and an electric connection at the junction structure is hard to be broken. The junction structure 10 is superior to the conventional junction structures also in terms of heat resistance.

The gold concentration in the AuSn eutectic phase is not limited in particular but may be on the order of 60 to 80 atom % or 66 to 77 atom % with respect to the whole AuSn eutectic phase. The tin concentration in the AuSn eutectic phase is not limited in particular but may be on the order of 20 to 40 atom % or 23 to 32 atom % with respect to the whole AuSn eutectic phase. The nickel concentration in the AuSn eutectic phase is not limited in particular but may be on the order of 0 to 10 atom % or 0 to 6 atom % with respect to the whole AuSn eutectic phase. In this embodiment, the concentration of an element is synonymous with the content of the element.

An AuSnNi alloy phase may be segregated in a part of the second metal layer 12 located on the first metal layer side. The AuSnNi alloy phase is a phase constituted by an alloy containing Au, Sn, and Ni. The AuSnNi alloy phase may abut on a surface of the first metal layer 11. A part of the second metal layer 12 located on the first metal layer side may be an AuSnNi alloy layer 13 including the AuSnNi alloy phase. The AuSnNi alloy layer 13 may be constituted by the AuSnNi alloy phase alone. When the AuSnNi alloy phase in the second metal layer 12 is distributed lopsidedly to the first metal layer side, the bonding strength of the junction structure 10 tends to improve more. The AuSnNi alloy phase may also be an intermetallic compound among gold, tin, and nickel.

The gold concentration in the AuSnNi alloy phase is not limited in particular but may be on the order of 25 to 55 atom % or 30 to 49 atom % with respect to the whole AuSnNi alloy phase. The tin concentration in the AuSnNi alloy phase is not limited in particular but may be on the order of 25 to 45 atom % or 31 to 39 atom % with respect to the whole AuSnNi alloy phase. The nickel concentration in the AuSnNi alloy phase is not limited in particular but may be on the order of 10 to 40 atom % or 15 to 35 atom % with respect to the whole AuSnNi alloy phase.

An AuSn eutectic phase may be segregated in a part of the second metal layer 12 on the side opposite from the first metal layer 11. That is, the AuSn eutectic phase may exist in a part of the second metal layer 12 located on the second substrate 60 side. A part of the second metal layer 12 located on the side opposite from the first metal layer may be an AuSn eutectic layer 14 including the AuSn eutectic phase. The AuSn eutectic layer 14 may be constituted by the AuSn eutectic phase alone. The AuSn eutectic phase may be separated from the first metal layer 11. A part of the AuSn eutectic phase may abut on the surface of the first metal layer 11. When the AuSn eutectic phase is distributed lopsidedly as mentioned above, the bonding strength of the junction structure 10 tends to improve more.

The second metal layer 12 may include an Au- or Sn-rich phase. The Au-rich phase is a part of the AuSn eutectic phase where gold is segregated. The gold concentration (unit: atom %) in the Au-rich phase tends to be higher than that (average concentration) in the whole AuSn eutectic phase. The gold concentration in the Au-rich phase tends to be higher than that in the Sn-rich phase. The Sn-rich phase is a part of the AuSn eutectic phase where tin is segregated. The tin concentration (unit: atom %) in the Sn-rich phase tends to be higher than that (average concentration) in the whole AuSn eutectic phase. The tin concentration in the Sn-rich phase tends to be higher than that in the Au-rich phase. The gold concentration in the Au-rich phase is not limited in particular but may be 75 to 95 atom % or 80 to 90 atom %. The tin concentration in the Au-rich phase is not limited in particular but may be on the order of 5 to 25 atom % or 10 to 20 atom %. The gold concentration in the Sn-rich phase is not limited in particular but may be on the order of 50 to 70 atom % or 51 to 65 atom %. The tin concentration in the Sn-rich phase is not limited in particular but may be on the order of 30 to 50 atom % or 35 to 49 atom %.

Nickel may be distributed unevenly in the AuSn eutectic phase. That is, a phase in which nickel is segregated (Ni-segregated phase) may exist in the AuSn eutectic phase. The Ni-segregated phase is an alloy phase which is a part of the AuSn eutectic phase where the nickel concentration is higher than that (average concentration) in the whole AuSn eutectic phase. When Ni is distributed unevenly in the AuSn eutectic phase, the junction structure 10 tends to improve its bonding strength more and its heat resistance.

Sn may be segregated about nickel distributed unevenly in the AuSn eutectic phase. That is, the Ni-segregated phase may be surrounded by the Sn-rich phase. Hence, the Ni-segregated phase may be included in the Sn-rich phase. When the Ni-segregated phase is surrounded by the Sn-rich phase alone, the junction structure 10 tends to improve its bonding strength more and its heat resistance. The Ni-segregated phase may also be surrounded by both of the Sn- and Au-rich phases.

A part of the second metal layer 12 located on the first metal layer 11 side may be the above-mentioned AuSnNi alloy layer 13, and the nickel concentration in the AuSnNi alloy layer 13 may decrease with as the distance from the first metal layer 11 increases. The nickel concentration in the AuSnNi alloy layer 13 may decrease from the position closest to the first metal layer 11 to the position farthest from the first metal layer 11. That is, the nickel concentration distribution in the AuSnNi alloy layer 13 or AuSnNi alloy phase may have such a gradient that the nickel concentration decreases substantially continuously in a direction from the first metal layer 11 to the second metal layer 12. The fact that the nickel concentration distribution is substantially continuous in the first and second metal layers 11, 12 tends to improve the bonding strength of the junction structure 10 more.

The nickel concentration in the first metal layer 11 may decrease as the distance from the second metal layer 12 decreases. That is, the nickel concentration distribution in the first metal layer 11 may have such a gradient that the nickel concentration decreases substantially continuously in a direction from the inside of the first metal layer 11 to the second metal layer 12. The fact that the nickel concentration distribution is substantially continuous in the first and second metal layers 11, 12 tends to improve the bonding strength of the junction structure 10 more.

The junction structure 10 may comprise the first metal layer 11, the above-mentioned AuSnNi alloy layer 13 mounted on the first metal layer 11, and the above-mentioned AuSn eutectic layer 14 mounted on the AuSnNi alloy layer 13. That is, the second metal layer 12 may include the AuSnNi alloy layer 13 and AuSn eutectic layer 14 so as to construct the junction structure 10 from the three layers mentioned above. When the junction structure 10 has such a three-layer structure, the layers are likely to adhere to each other, whereby damages are harder to occur at the interfaces (junction interfaces) between the AuSn eutectic layer 14 and its adjacent layers. Therefore, the bonding strength of the junction structure 10 tends to improve easily. An Au phase constituted by gold alone may exist between the AuSn eutectic layer 14 and the second substrate 60 (or seed layer 17). An Au layer constituted by the Au phase alone may exist between the AuSn eutectic layer 14 and the second substrate 60 (or seed layer 17). That is, the Au layer may be mounted on the AuSn eutectic layer 14. An AuSn alloy phase constituted by an AuSn alloy alone may exist between the AuSn eutectic layer 14 and the second substrate 60 (or seed layer 17). An AuSn alloy layer constituted by the AuSn alloy phase alone may exist between the AuSn eutectic layer 14 and the second substrate 60 (or seed layer 17). That is, the AuSn alloy layer may be mounted on the AuSn eutectic layer 14.

The nickel concentration in the first metal layer 11 is not limited in particular but may be on the order of 70 to 100 atom % with respect to the whole first metal layer. The first metal layer 11 may contain phosphorus, sulfur, carbon, and the like. By containing these elements, the first metal layer 11 tends to improve its hardness, thereby increasing the bonding strength of the junction structure 10.

The thickness of the first metal layer 11 is not limited in particular but may be on the order of 1.0 to 20 µm.

The thickness of the second metal layer 12 is not limited in particular but may be on the order of 1.0 to 10 µm.

The concentration of each element at a given position in the junction structure 10 is measured by the following method. First, the junction structure 10 is cut along the stacking direction of the first and second metal layers 11, 12. Analyzing thus exposed cross section of the junction structure 10 by the above-mentioned EDS or a method such as Auger electron spectroscopy (AES) specifies the concentration of each element.

The thickness of each layer in the junction structure 10 is measured by the following method. First, the junction structure 10 is cut along the stacking direction. Thus exposed cross section is observed under a magnification of about 100,000× with the above-mentioned SEM or a transmission electron microscope (TEM). Then, thicknesses of each layer measured at a plurality of locations (e.g., three locations) arbitrarily selected from the cross section are averaged, so as to compute the thickness of each layer.

Method for Manufacturing Junction Structure

An example of methods for manufacturing the junction structure 10 of this embodiment will now be explained. The method for manufacturing the junction structure 10 comprises the steps of forming a first precursor structure on a surface of the first substrate 40, forming a second precursor structure on a surface of the second substrate 60, and joining the first and second precursor structures to each other.

The First Precursor Structure Forming Step

Figure 3A:
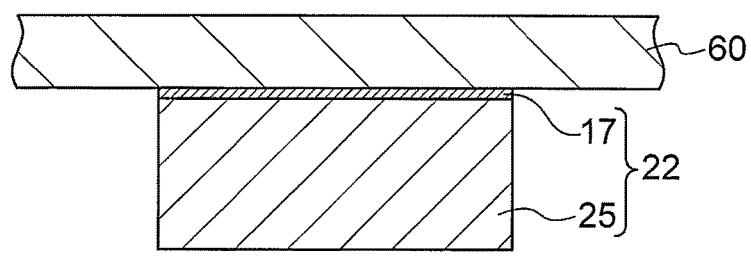
FIGS. 3(a) and 3(b) are schematic views illustrating an embodiment of a method for manufacturing the junction structure in accordance with the present invention.
Figure 3B:
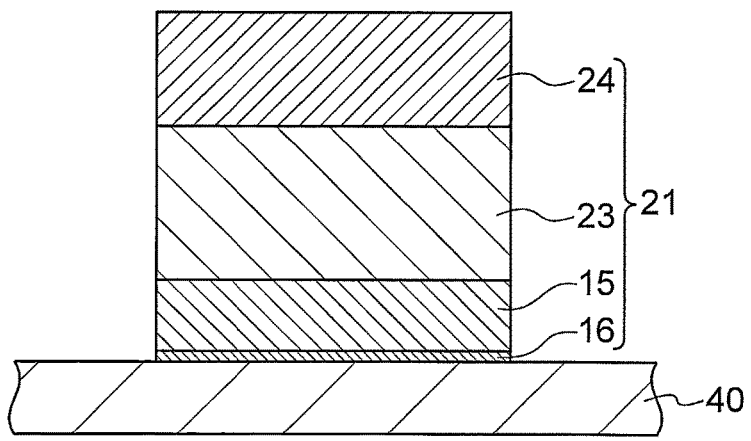

FIG. 3(b) is a sectional view schematically illustrating a first precursor structure 21 formed on the first substrate 40. The first precursor structure 21 is constituted by the seed layer 16 formed on the first substrate 40, the conductor layer 15 formed on the seed layer 16, a nickel layer 23 mainly composed of nickel and formed on the conductor layer 15, and a tin layer 24 mainly composed of tin and formed on the nickel layer 23. The first precursor structure 21 is formed by the following method.

The seed layer 16 and conductor layer 15 are formed on the first substrate 40. The seed layer 16 and conductor layer 15 may be formed by sputtering, chemical vapor deposition, plating, or the like. Examples of materials for the seed layer 16 include titanium and chromium which are used in general. The seed layer 16 enhances the adhesion between the first substrate 40 and the conductor layer 15. The conductor layer 15 may be formed directly on a surface of the first substrate 40 without the seed layer 16 interposed therebetween. Examples of metals constituting the conductor layer 15 include those excellent in electrical conductivity such as copper, gold, silver, and aluminum. The conductor layer 15 may be patterned with a resist film. Before peeling the resist film and seed layer 16 from the surface of the first substrate 40 (excluding the part formed with the conductor layer 15), the layers constituting the first precursor structure 21 may be formed by electrolytic or electroless plating. After peeling the resist film and seed layer 16 from the surface of the first substrate 40 (excluding the part formed with the conductor layer 15), the layers constituting the first precursor structure 21 may be formed on the conductor layer 15 by electroless plating. The electroless plating can easily adjust the position and form of each layer.

After preprocessing the conductor layer 15 as necessary, the nickel layer 23 is formed on the conductor layer 15. When composed of gold, silver, copper, or an alloy mainly composed of the same, the conductor layer 15 may be subjected to degreasing, pickling, activation, and the like as the preprocessing. When composed of aluminum or an aluminum alloy, the conductor layer 15 may be subjected to degreasing, pickling, zincate treatment, and the like as the preprocessing.

The nickel layer 23 may be formed by electroless or electrolytic nickel plating. The electroless nickel plating forms the nickel layer 23 from a plating solution containing a nickel salt, a complexing agent, and a reducing agent, for example. A plating solution containing hypophosphorous acid may be used as the reducing agent. Using the plating solution containing hypophosphorous acid improves the workability of electroless nickel plating (bath stability and nickel deposition rate). The temperature of the electroless nickel plating solution may be 50 to 95° C. or 60 to 90° C. The electroless nickel plating solution may contain phosphorus. The electroless nickel plating solution may have a pH on the order of 4.0 to 6.0. The pH may be adjusted with dilute sulfuric acid or ammonia, for example.

The electrolytic nickel plating may use a plating solution containing nickel sulfate, nickel chloride, and boric acid, for example. The electrolytic nickel plating solution may contain phosphorus. In this case, the plating solution may have a pH of 4.5 to 5.5. The temperature of the plating solution may be 40 to 60° C. The current density at the time of plating may be 1 to 7 A/dm$^2$.

The tin layer 24 is formed on the nickel layer 23. The tin layer 24 may be formed by reduction-type electroless tin plating or electrolytic tin plating, for example.

The reduction-type electroless tin plating may use a plating solution containing a tin compound, an organic complexing agent, an organic sulfur compound, an antioxidant, and a reducing agent (titanium compound), for example. The temperature of the plating solution may be on the order of 40 to 90° C. or 50 to 80° C.

The electrolytic nickel plating may employ a ferrostan process, a halogen process, an alkali process, or the like. The ferrostan and halogen processes use an acidic solution. The ferrostan process uses tin phenolsulfonate. The halogen process uses stannous chloride. The alkali method uses a plating solution mainly composed of sodium stannate.

The foregoing steps form on the first substrate 40 the first precursor structure 21 in which the seed layer 16, conductor layer 15, nickel layer 23, and tin layer 24 are stacked sequentially.

The Second Precursor Structure Forming Step

FIG. 3(a) is a sectional view schematically illustrating a second precursor structure 22 formed on the second substrate 60. The second precursor structure 22 is constituted by the seed layer 17 disposed on the second substrate 60 and a gold layer 25 containing gold formed on the seed layer 17. As with the first precursor structure 21, the second precursor structure 22 is produced by forming the seed layer 17 on the second substrate 60 and forming the gold layer 25 on the seed layer 17. Examples of methods for forming the gold layer 25 include sputtering, chemical vapor deposition, and plating. Examples of the plating include electroless gold plating and electrolytic gold plating. Plating solutions are not limited in types.

The Step of Joining the First and Second Precursor Structures 21, 22

The second substrate 60 is mounted on the first substrate 40 such that the tin layer 24 of the first precursor structure 21 and the gold layer 25 of the second precursor structure 22 oppose each other.

The first and second precursor structures 21, 22 are bonded to each other under pressure while being heated. The heating causes the tin layer 24 having a lower melting point to melt before the gold layer 25, so as to wet and spread over the whole surface of the gold layer 25. A part of the nickel layer 23 migrates (diffuses) into the tin layer 24. The molten tin layer 24, at least part of the gold layer 25, and nickel having migrated into the tin layer 24 are mixed together. Cooling these metals turns the nickel layer 23 into the first metal layer 11, forms the second metal layer 12 containing gold, tin, and nickel on the first metal layer 11, and deposits an AuSn eutectic phase in the second metal layer 12. A part of the gold layer 25 may remain as a residual layer (a layer adjacent to the second metal layer 12) without contributing to forming the AuSn eutectic phase. The residual layer may be constituted by either an Au phase in which a part of the gold layer 25 remains alone or an AuSn alloy phase in which a part of the gold layer 25 is mixed with molten tin. However, the residual layer is distinguished from the AuSn eutectic phase in that the residual layer is substantially composed of a single metal (elementary Au) alone or single alloy (AuSn alloy) alone.

The above-mentioned steps form the junction structure 10 and join the first and second substrates 40, 60 to each other through the junction structure 10.

If there is no nickel layer 23, tin atoms constituting the tin layer 24 may migrate (diffuse) in excess toward the conductor layer 15 in the joining step, thereby forming a brittle tin alloy. In this embodiment, however, the nickel layer 23 inhibits tin from migrating from the tin layer 24 to the conductor layer 15, thereby suppressing a reaction by which the conductor layer 15 and tin produce the brittle tin alloy. By restraining the brittle tin alloy from being produced, the junction structure 10 improves its bonding strength.

The joining step may heat the first and second precursor structures 21, 22 to a temperature of 280 to 400° C. The first and second precursor structures 21, 22 may be heated for 0.1 to 120 seconds. When the heating temperature and heating time fall within these ranges, the tin layer 24 is easier to melt, whereby the bonding structure 10 excellent in bonding strength is formed easily.

The joining step may heat the first and second precursor structures 21, 22 by using a flip chip bonder or reflow oven.

The composition and thickness of the first metal layer 11, the composition and thickness of the second metal layer 12, and the respective compositions of phases in the second metal layer 12 are freely controlled by the following conditions:

The composition, thickness, and plating method of the nickel layer 23.

The composition, thickness, and plating method of the tin layer 24.

The composition, thickness, and plating method of the gold layer 25.

The heating temperature and heating time in the joining step.

The above-mentioned method for manufacturing the junction structure 10 inhibits voids and cracks from occurring between the layers constituting the junction structure 10 and improves the bonding strength of the junction structure 10.

Junction structures using the conventional AuSn braze material are required to provide gold layers on both of a pair of members to be joined together. By contrast, this embodiment can, manufacture the junction structure 10 excellent in the bonding strength by providing the gold layer 25 on one of the members (the second substrate 60) alone. Therefore, this embodiment uses expensive gold by a smaller amount and thus reduces the cost of manufacturing the junction structure 10.

The melting point of the AuSn eutectic phase in the second metal layer 12 is higher than that of conventional solders based on Sn—Ag-based alloys and the like. Therefore, in the making of an electronic device which necessitates two or more joining operations, the junction structure 10 of this embodiment is formed in the primary joining. After the primary joining, a solder having a melting point lower than that of the AuSn eutectic phase is used for the secondary joining. The second metal layer 12 including the AuSn eutectic phase is hard to melt at the temperature of the solder heated in the secondary joining (the melting point of the solder). That is, the junction structure 10 of this embodiment is so excellent in heat resistance as to be hard to deteriorate in the process of manufacturing an electronic device which necessitates a plurality of joining operations (heating steps).

A substrate and an electronic component may be joined to each other by the junction structure 10, and electronic components may also be joined together by the same way as the above embodiment.

EXAMPLES

The present invention will now be explained in more detail with reference to examples and comparative examples, but is not restricted to the following examples.

Example 1

The First Precursor Structure Forming Step

A silicon substrate was prepared as a first substrate. The first substrate had a size of 10 mm×10 mm with a thickness of 0.6 mm. A seed layer composed of titanium was formed on a surface (part to be joined) of the first substrate, and then a conductor layer composed of copper was formed by electrolytic plating on the seed layer. At this time, the size and thickness of the conductor layer were adjusted by patterning with a resist film. The conductor layer had a size of 100 μm×100 μm with a thickness of 5 μm.

The resist film and seed layer were peeled from the surface of the first substrate (excluding the part formed with the conductor layer). The first substrate formed with the conductor layer was dipped in an electroless nickel plating solution containing hypophosphite ions (a reducing agent), so as to form a nickel layer having a thickness of 3 μm on a surface of the conductor layer. The nickel layer was constituted by nickel which was a main component and phosphorus. The phosphorus concentration in the nickel layer was 17 at % (atom %).

The first substrate formed with the nickel layer was dipped in an electroless tin plating solution containing trivalent titanium ions (a reducing agent), so as to form a tin layer having a thickness of 0.5 μm on a surface of the nickel layer. The foregoing step formed the first precursor structure on the first substrate.

The Second Precursor Structure Forming Step

A silicon substrate was prepared as a second substrate. The second substrate had a size of 0.2 mm×0.2 mm with a thickness of 0.6 mm. Subsequently, a seed layer was formed on a part to be joined of the second substrate by the method mentioned above. A gold layer was formed on a surface of the seed layer by electrolytic gold plating. At this time, the size and thickness of the gold layer were adjusted by patterning with a resist film. The gold layer had a size of 100 μm×100 μm with a thickness of 1.7 μm. The foregoing step formed the second precursor structure on the second substrate.

The Step of Joining the First and Second Precursor Structures

The second substrate was mounted on the first substrate such that the tin layer of the first precursor structure and the gold layer of the second precursor structure opposed each other. The first and second precursor structures were heated at 300° C. for 60 sec in a nitrogen atmosphere, so as to be bonded to each other under pressure, and then cooled rapidly. A flip chip bonder was used for the thermocompression bonding. The foregoing step produced the junction structure of Example 1.

Example 2

The junction structure of Example 2 was produced by the same method as with Example 1 except that the thickness of the tin layer in the first precursor structure was 1.1 μm.

Example 3

The junction structure of Example 3 was produced by the same method as with Example 2 except that the first and second precursor structures were heated at 320° C. in the thermocompression bonding.

Example 4

The junction structure of Example 4 was produced by the same method as with Example 3 except that the thickness of the tin layer in the first precursor structure was 1.6 μm.

Example 5

The junction structure of Example 5 was produced by the same method as with Example 4 except that the first and second precursor structures were heated at 340° C. in the thermocompression bonding.

Example 6

The junction structure of Example 6 was produced by the same method as with Example 4 except that the thickness of the gold layer in the second precursor structure was 3.0 μm.

Example 7

The junction structure of Example 7 was produced by the same method as with Example 6 except that the first and second precursor structures were heated at 340° C. in the thermocompression bonding.

Example 8

In the process of making the first precursor structure of Example 8, before peeling the resist film and seed layer from the surface of the first substrate, the nickel layer was formed by using an electrolytic nickel plating solution containing no phosphorus, and the tin layer was formed by electrolytic tin plating. Thereafter, the resist film and seed layer were peeled from the surface of the first substrate (excluding the part formed with the conductor layer). The nickel layer of Example 8 was composed of nickel alone. The junction structure of Example 8 was produced by the same method as with Example 6 except for the processes of forming the nickel and tin layers.

Example 9

The junction structure of Example 9 was produced by the same method as with Example 8 except that the nickel layer in the first precursor structure was formed from an electrolytic nickel plating solution containing phosphorus.

Example 10

The junction structure of Example 10 was produced by the same method as with Example 6 except that the conductor layer in the first precursor structure was formed by electrolytic gold plating. The conductor layer in the first precursor structure was a layer composed of gold having a thickness of 1 µm.

Comparative Example 1

A silicon substrate identical to those of the examples was prepared as a first substrate. A seed layer composed of titanium was formed in a part of the first substrate to be joined. A conductor layer composed of copper was formed on a surface of the seed layer by electrolytic copper plating. At this time, the size and thickness of the conductor layer were adjusted by patterning with a resist film. The conductor layer had a size of 100 µm×100 µm with a thickness of 5 µm.

The resist film and seed layer were peeled from the surface of the first substrate (excluding the part formed with the conductor layer). The first substrate formed with the conductor layer was dipped in an electroless nickel plating solution containing hypophosphite ions (a reducing agent), so as to form a nickel layer having a thickness of 3 µm on a surface of the conductor layer. The nickel layer was constituted by nickel which was a main component and phosphorus. The phosphorus concentration in the nickel layer was 17 at % (atom %).

A gold layer having a thickness of 1.0 µm was formed on a surface of the nickel layer by electroless gold plating.

An AuSn braze layer having a thickness of 2 µm was formed on a surface of the gold layer by sputtering. The AuSn braze layer was composed of the conventional AuSn-based braze material. That is, the AuSn braze layer was constituted by gold and tin. The gold concentration in the AuSn braze layer was 71 at % (atom %). The foregoing step produced the first precursor structure of Comparative Example 1.

The second precursor structure of Comparative Example 1 was made by the same method as with Example 1.

The second substrate was mounted on the first substrate such that the AuSn braze layer in the first precursor structure and the gold layer in the second precursor structure opposed each other. The first and second precursor structures were heated at 320° C. for 60 sec in a nitrogen atmosphere, so as to be bonded to each other under pressure, and then cooled rapidly. A flip chip bonder was used for the thermocompression bonding. The foregoing step produced the junction structure of Comparative Example 1.

Comparative Example 2

A silicon substrate identical to those of the examples was prepared as a first substrate. A seed layer composed of titanium was formed on a part to be joined of the first substrate. A conductor layer composed of gold was formed on a surface of the seed layer by electrolytic gold plating. At this time, the size and thickness of the conductor layer were adjusted by patterning with a resist film. The gold layer had a size of 100 µm×100 µm with a thickness of 1 µm.

A gold layer having a thickness of 2.0 µm was formed on a surface of the conductor layer by electrolytic gold plating.

The resist film and seed layer were peeled from the surface of the first substrate (excluding the part formed with the conductor layer). An AuSn braze layer having a thickness of 2 µm was formed on a surface of the gold layer by sputtering. The AuSn braze layer was composed of the conventional AuSn-based braze material. That is, the AuSn braze layer was constituted by gold and tin. The gold concentration in the AuSn braze layer was 69 at % (atom %). The foregoing step produced the first precursor structure of Comparative Example 2.

The junction structure of Comparative Example 2 was made by the same method as with Comparative Example 1 except for the process of producing the first precursor structure.

Comparative Example 3

A silicon substrate identical to those of the examples was prepared as a first substrate. A seed layer composed of titanium was formed on a part to be joined of the first substrate. A conductor layer composed of gold was formed on a surface of the seed layer by electrolytic gold plating. At this time, the size and thickness of the conductor layer were adjusted by patterning with a resist film. The gold layer had a size of 100 µm×100 µm with a thickness of 1 µm.

A nickel layer (a layer composed of nickel alone) having a thickness of 3 µm was formed on a surface of the conductor layer by electrolytic nickel plating.

A gold layer having a thickness of 0.5 µm was formed on a surface of the nickel layer by electrolytic gold plating.

The resist film and seed layer were peeled from the surface of the first substrate (excluding the part formed with the conductor layer). An AuSn braze layer similar to that of Comparative Example 1 was formed on a surface of the gold layer by sputtering. The foregoing step produced the first precursor structure of Comparative Example 3.

The second precursor structure of Comparative Example 3 was made by the same method as with Example 1.

The second substrate was mounted on the first substrate such that the AuSn braze layer in the first precursor structure and the gold layer in the second precursor structure opposed each other. The first and second precursor structures were heated at 340° C. for 60 sec in a nitrogen atmosphere, so as to be bonded to each other under pressure, and then cooled rapidly. A flip chip bonder was used for the thermocompression bonding. The foregoing step produced the junction structure of Comparative Example 3.

The following Table 1 lists various conditions in the steps of producing the junction structures of the examples and comparative examples mentioned above. The "foundation layer" listed in Table 1 is a layer formed on the surface of the conductor layer. The "surface layer" is a layer formed on the surface of the foundation layer. However, the surface layer was formed directly on the surface of the conductor layer in the first precursor structure of Comparative Example 2.

TABLE 1

| | First precursor structure | | |
|---|---|---|---|
| | | Foundation layer | |
| | Conductor layer Plating type | Plating type | P conc. [at %] |
| Example 1 | electrolytic Cu plating | electroless Ni plating | 17 |
| Example 2 | electrolytic Cu plating | electroless Ni plating | 17 |
| Example 3 | electrolytic Cu plating | electroless Ni plating | 17 |
| Example 4 | electrolytic Cu plating | electroless Ni plating | 17 |
| Example 5 | electrolytic Cu plating | electroless Ni plating | 17 |
| Example 6 | electrolytic Cu plating | electroless Ni plating | 17 |
| Example 7 | electrolytic Cu plating | electroless Ni plating | 17 |
| Example 8 | electrolytic Cu plating | electrolytic Ni plating | 0 |
| Example 9 | electrolytic Cu plating | electrolytic Ni plating | 3 |
| Example 10 | electrolytic Au plating | electroless Ni plating | 17 |
| Comparative Example 1 | electrolytic Cu plating | electroless Ni plating | 17 |
| Comparative Example 2 | electrolytic Au plating | — | — |
| Comparative Example 3 | electrolytic Au plating | electrolytic Ni plating | 0 |

| | First precursor structure | | |
|---|---|---|---|
| | Surface layer | AuSn braze layer | |
| | Plating type | Thickness [μm] | Thickness [μm] | Au conc. [at %] |
| Example 1 | electroless Sn plating | 0.5 | — | — |
| Example 2 | electroless Sn plating | 1.1 | — | — |
| Example 3 | electroless Sn plating | 1.1 | — | — |
| Example 4 | electroless Sn plating | 1.6 | — | — |
| Example 5 | electroless Sn plating | 1.6 | — | — |
| Example 6 | electroless Sn plating | 1.6 | — | — |
| Example 7 | electroless Sn plating | 1.6 | — | — |
| Example 8 | electrolytic Sn plating | 1.6 | — | — |
| Example 9 | electrolytic Sn plating | 1.6 | — | — |
| Example 10 | electroless Sn plating | 1.6 | — | — |
| Comparative Example 1 | electroless Au plating | 1.0 | 2.0 | 71 |
| Comparative Example 2 | electrolytic Au plating | 2.0 | 2.0 | 69 |
| Comparative Example 3 | electrolytic Au plating | 0.5 | 2.0 | 71 |

TABLE 1-continued

| | Second precursor structure Au layer | | |
|---|---|---|---|
| | Plating type | Thickness [μm] | Thermocompression condition |
| Example 1 | electrolytic Au plating | 1.7 | 300° C., 60 sec |
| Example 2 | electrolytic Au plating | 1.7 | 300° C., 60 sec |
| Example 3 | electrolytic Au plating | 1.7 | 320° C., 60 sec |
| Example 4 | electrolytic Au plating | 1.7 | 320° C., 60 sec |
| Example 5 | electrolytic Au plating | 1.7 | 340° C., 60 sec |
| Example 6 | electrolytic Au plating | 3.0 | 320° C., 60 sec |
| Example 7 | electrolytic Au plating | 3.0 | 340° C., 60 sec |
| Example 8 | electrolytic Au plating | 3.0 | 320° C., 60 sec |
| Example 9 | electrolytic Au plating | 3.0 | 320° C., 60 sec |
| Example 10 | electrolytic Au plating | 3.0 | 320° C., 60 sec |
| Comparative Example 1 | electrolytic Au plating | 1.7 | 320° C., 60 sec |
| Comparative Example 2 | electrolytic Au plating | 1.7 | 320° C., 60 sec |
| Comparative Example 3 | electrolytic Au plating | 1.7 | 340° C., 60 sec |

Analysis of Configuration and Composition of the Junction Structure

A cross section in the stacking direction of each junction structure was observed with SEM. Each cross section was also analyzed by EDS, so as to measure the concentration of each element in a predetermined part of the junction structure.

As a result of the analysis, the junction structure 10 of each of Examples 1 to 10 was seen to comprise the first metal layer 11 mounted on the conductor layer 15 and the second metal layer 12 mounted on the first metal layer 11, the first metal layer 11 containing nickel, the second metal layer containing gold, tin, and nickel and further including an AuSn eutectic phase. The junction structure 10 of each of Examples 1 to 10 was also seen to comprise the first metal layer 11, the AuSnNi alloy layer 13 mounted on the first metal layer 11, and the AuSn eutectic layer 14 mounted on the AuSnNi alloy layer 13. That is, the second metal layer 12 in the junction structure 10 of each of Examples 1 to 10 was seen to include the AuSnNi alloy layer 13 and the AuSn eutectic layer 14.

Figure 4:
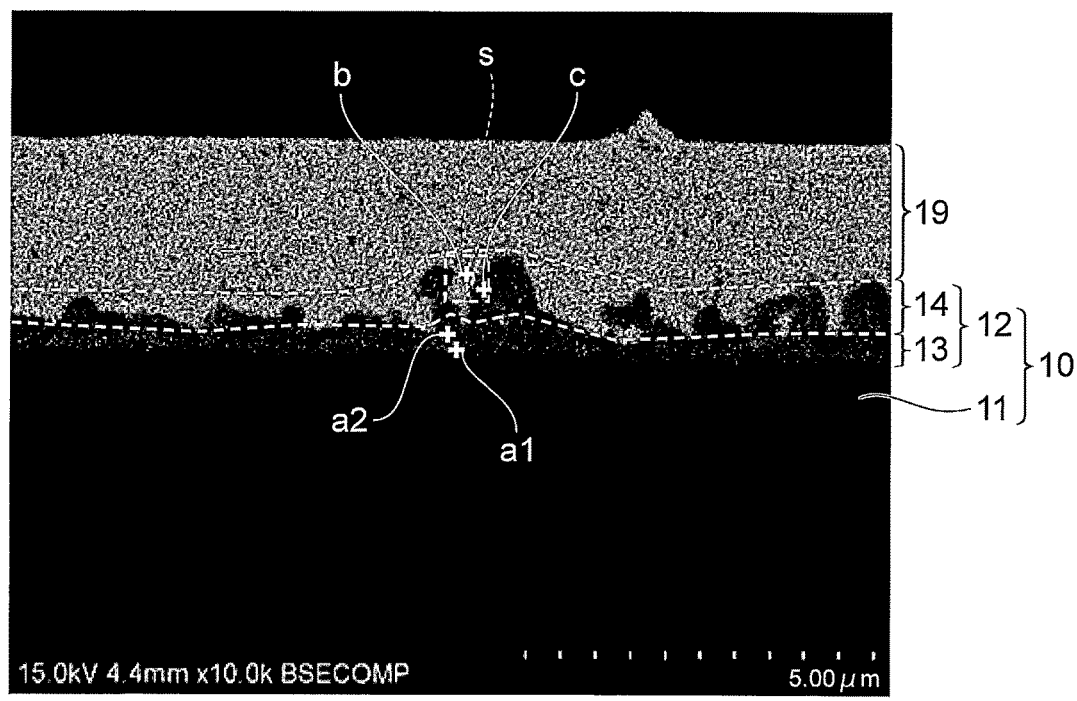
FIG. 4 is a photograph of a cross section of the junction structure of Example 1 taken by a scanning electron microscope (SEM), illustrating a part analyzed by energy dispersive X-ray spectroscopy (EDS)

As FIG. 4 illustrates, a residual layer 19 whose color gradation was substantially indiscernible in the SEM image was seen to exist between the AuSn eutectic layer 14 and the second substrate in Example 1. Of the gold layer 25 in the second precursor structure 22, the residual layer 19 was a part left without contributing to forming the AuSn eutectic phase. In the junction structure 10 of any of the other examples, the residual layer 19 did not exist between the AuSn eutectic layer 14 and the second substrate. In the junction structure 10 of each of Comparative Examples 1 to 3, a gold layer 33 adjacent to the seed layer 17 was seen to have been formed on the second substrate side (see FIG. 8).

The junction structure of Comparative Example 1 was seen to comprise a first metal layer (Ni layer) mounted on a conductor layer (Cu layer), an Au layer (Au layer on the first substrate side) mounted on the first metal layer, an AuSn eutectic layer mounted on the Au layer, and an Au layer (Au layer on the second substrate side) mounted on the AuSn eutectic layer.

The junction structure of Comparative Example 2 was seen to comprise an Au layer (Au layer on the first substrate side), an AuSn eutectic layer mounted on the Au layer, and an Au layer (Au layer on the second substrate side) mounted on the AuSn eutectic layer.

The junction structure of Comparative Example 3 was seen to comprise a first metal layer (Ni layer) mounted on a conductor layer (Au layer on the first substrate side), an Au layer mounted on the first metal layer, an AuSn eutectic layer mounted on the Au layer, and an Au layer (Au layer on the second substrate side) mounted on the AuSn eutectic layer.

Figure 5:
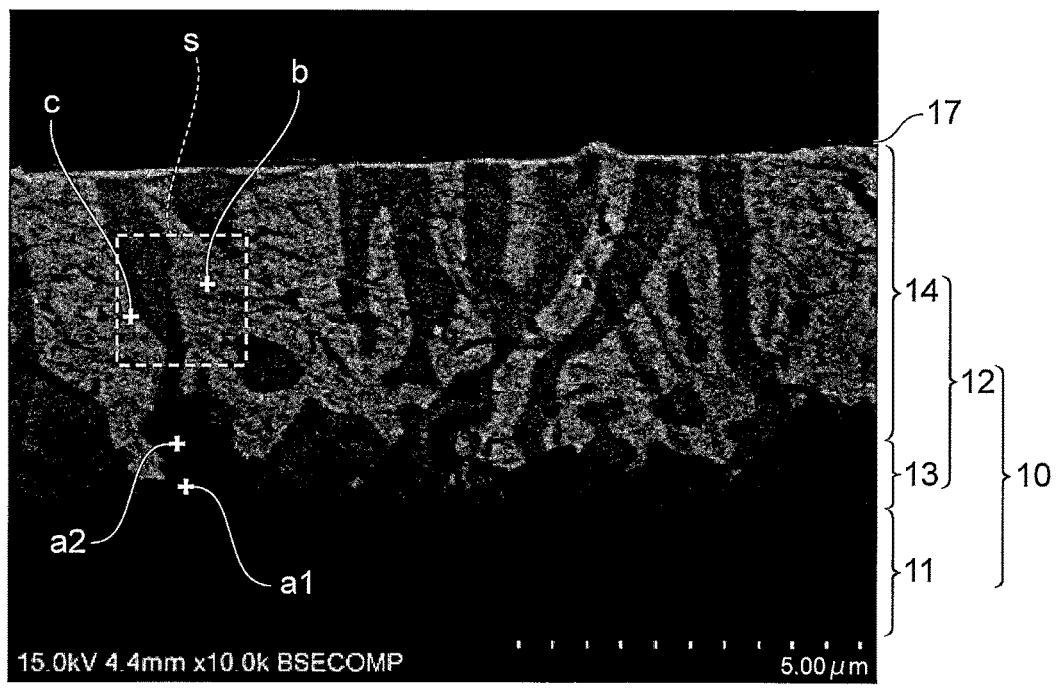
FIG. 5 is a photograph of a cross section of the junction structure of Example 2 taken by the SEM, illustrating a part analyzed by the EDS.
Figure 6:
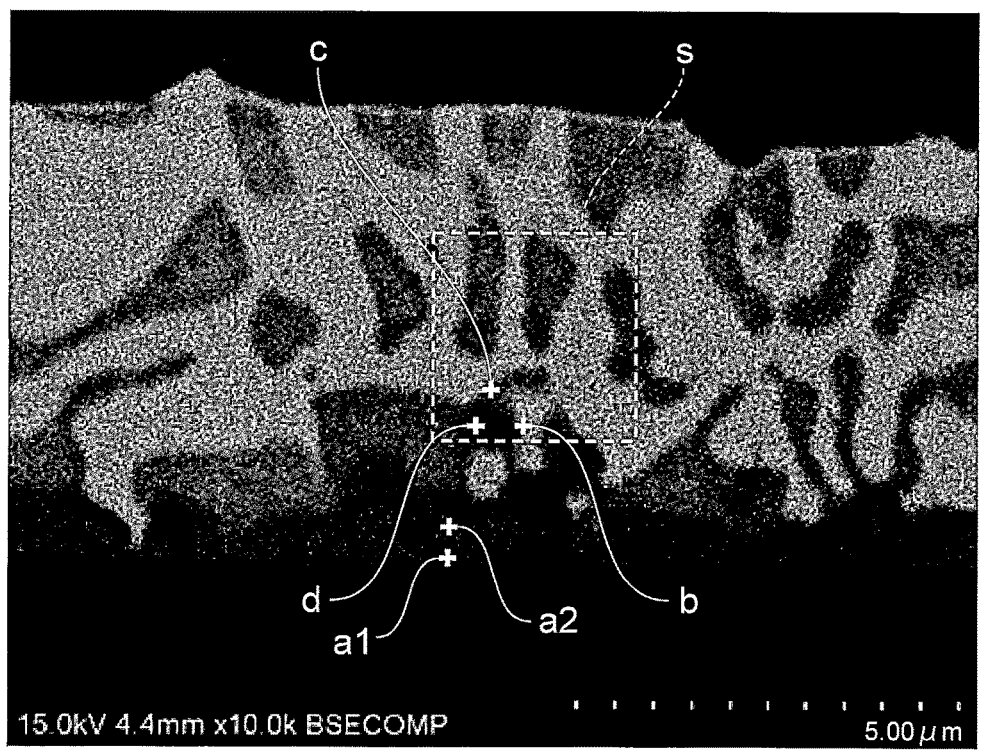
FIG. 6 is a photograph of a cross section of the junction structure of Example 4 taken by the SEM, illustrating a part analyzed by the EDS.
Figure 7A:
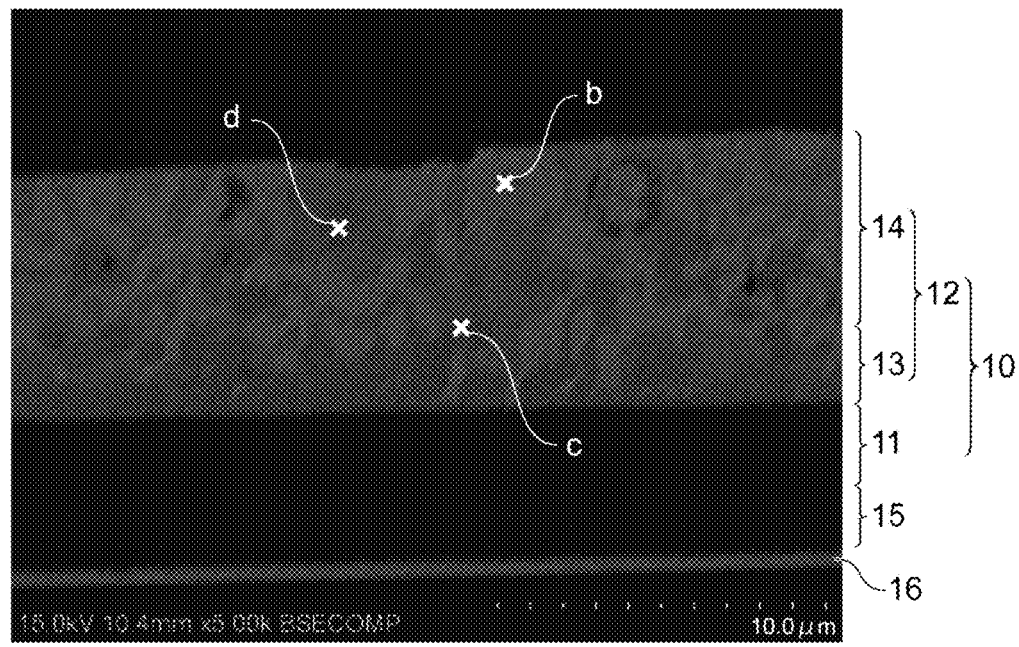
Figure 7B:
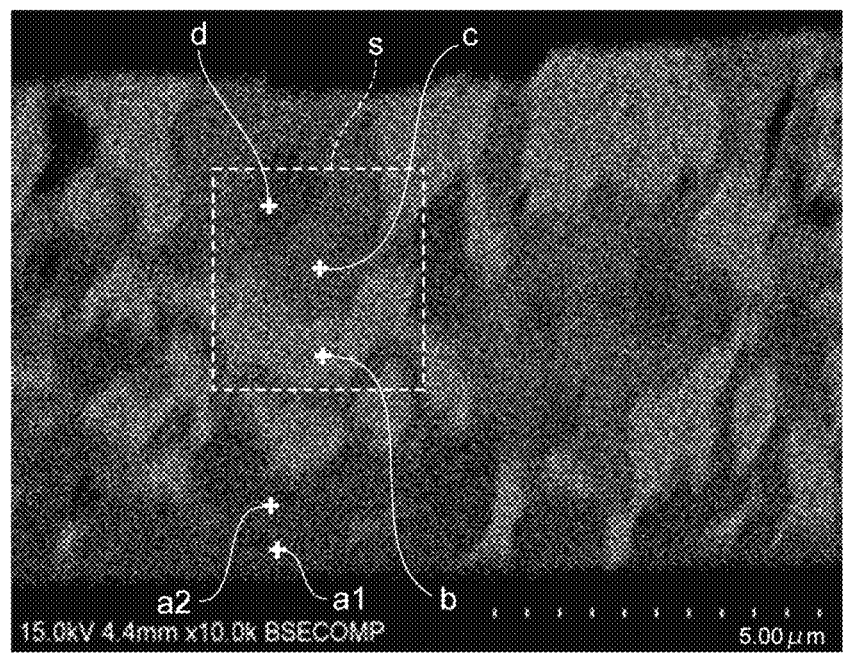
FIG. 7(b) is an enlarged view of FIG. 7(a) illustrating a part analyzed by the EDS.
Figure 8:
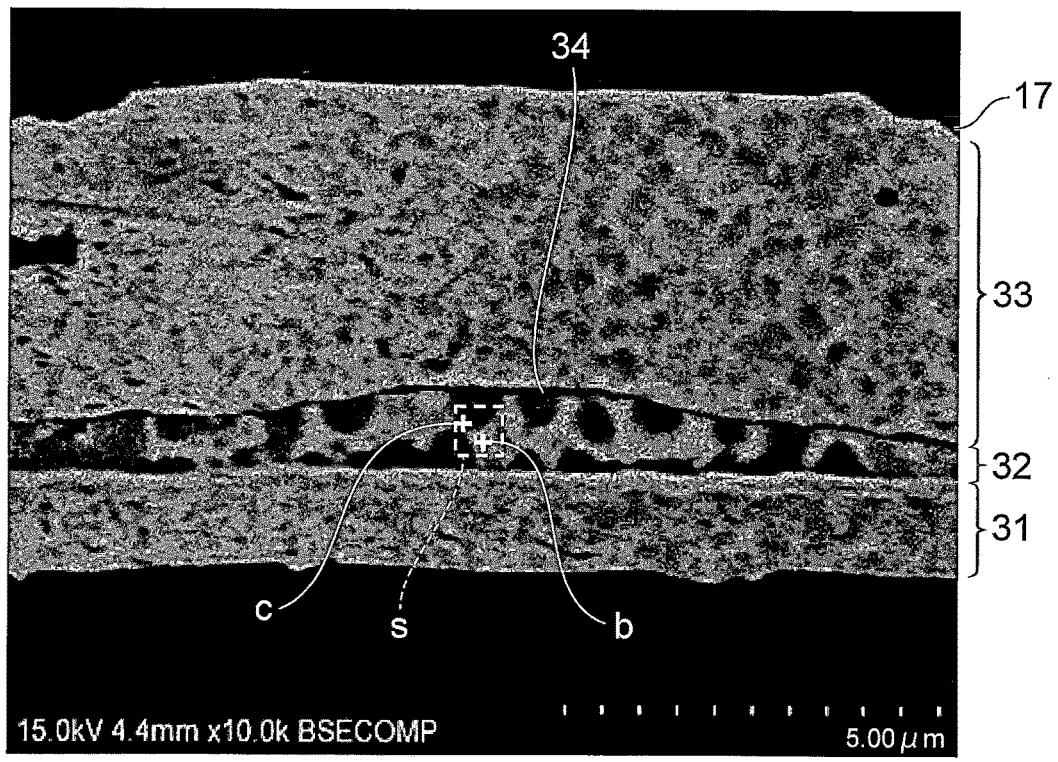
FIG. 8 is a photograph of a cross section of the junction structure of Comparative Example 1 taken by the SEM, illustrating a part analyzed by the EDS.

FIG. 4 is a photograph of a cross section of the junction structure of Example 1 taken by the SEM, illustrating a part analyzed by the EDS. FIG. 5 is a photograph of a cross section of the junction structure of Example 2 taken by the SEM, illustrating a part analyzed by the EDS. FIG. 6 is a photograph of a cross section of the junction structure of Example 4 taken by the SEM, illustrating a part analyzed by the EDS. FIG. 7(a) is a photograph of a cross section of the junction structure of Example 5 taken by the SEM. FIG. 7(b) is an enlarged view of FIG. 7(a) illustrating a part analyzed by the EDS. FIG. 8 is a photograph of a cross section of the junction structure of Comparative Example 1 taken by the SEM, illustrating a part analyzed by the EDS.

Parts a1 and a2 shown in the photographs mentioned above are locations (measurement points) where the concentration of each element was analyzed in the AuSnNi alloy phase. The part a1 is placed closer to the first metal layer than is the part a2.

In the photographs mentioned above, area s surrounded by a dotted line is one where the concentration of each element was analyzed in the AuSn eutectic phase. The AuSn eutectic phase was seen to include an Au-rich phase where the gold concentration was higher and an Sn-rich phase where the tin concentration was higher. Part b shown in the photographs mentioned above is a location (measurement point) where the concentration of each element was analyzed in the Au-rich phase. Part c is a location (measurement point) where the concentration of each element was analyzed in the Sn-rich phase. The Au- and Sn-rich phases are distinguished from each other in the AuSn eutectic phase according to the color depth in the SEM image. Relatively black and white parts are the Sn- and Au-rich phases, respectively. In a cross section of the AuSn eutectic layer, the composition of the AuSn eutectic phase was analyzed in a range where the Au- and Sn-rich phases had cross-sectional areas on a par with each other in an area surrounded by a square in which each side was a half T/2 of the thickness T of the AuSn eutectic layer.

As a result of the analysis by the EDS, the nickel concentration in the first metal layer 11 of Example 1 was seen to decrease as the distance from the second metal layer decreased. That is, the nickel concentration in the first metal layer 11 of Example 1 was seen to decrease with distance from the conductor layer 15 in the thickness direction of the first metal layer 11. The nickel concentration in the first metal layer 11 of Example 1 was 83 at % (atom %) in the part located closest to the conductor layer 15 and 78 at % (atom %) in the part located closest to the second metal layer 12. The Ni concentration distribution in the first metal layer 11 in each of Examples 2 to 7, 9, and 10 and Comparative Example 1 was seen to have substantially the same gradient as with Example 1.

Nickel was detected in the AuSn eutectic layer 14 in each of Examples 3 to 7 and 10. Regions where nickel existed were analyzed in detail, whereby an Ni-segregated phase containing nickel in addition to gold and tin was seen to scatter there. Part d shown in the photographs mentioned above is a location (measurement point) where the concentration of each element was analyzed in the Ni-segregated phase. In the Ni-segregated phases in Examples 3 to 7 and 10, those in contact with both of Au- and Sn-rich phases are denoted by A in the following Table 3. In the Ni-segregated phases in Examples 3 to 7 and 10, those included in the Sn-rich phase without contact with the Au-rich phase are denoted by B in the following Table 3. In the Ni-segregated phases in Examples 3 to 7 and 10, none was included in the Au-rich phase without contact with the Sn-rich phase.

Tables 2 and 3 list the concentration of each element at the above-mentioned measurement points a1, a2, b, c, and d and in the area s.

TABLE 2

| | First metal layer | |
| --- | --- | --- |
| | Component | Ni conc. gradient in thickness direction |
| Example 1 | Ni, P | yes |
| Example 2 | Ni, P | yes |
| Example 3 | Ni, P | yes |
| Example 4 | Ni, P | yes |
| Example 5 | Ni, P | yes |
| Example 6 | Ni, P | yes |
| Example 7 | Ni, P | yes |
| Example 8 | Ni | no |
| Example 9 | Ni, P | yes |
| Example 10 | Ni, P | yes |
| Comparative Example 1 | Ni, P | yes |
| Comparative Example 2 | — | — |
| Comparative Example 3 | Ni | no |

| | Second metal layer | | | | | |
| --- | --- | --- | --- | --- | --- | --- |
| | AuSnNi alloy phase (measurement point: a1) | | | AuSnNi alloy phase (measurement point: a2) | | |
| | Sn [at %] | Ni [at %] | Au [at %] | Sn [at %] | Ni [at %] | Au [at %] |
| Example 1 | 36 | 20 | 44 | 37 | 18 | 45 |
| Example 2 | 35 | 21 | 44 | 37 | 17 | 46 |
| Example 3 | 35 | 25 | 40 | 38 | 20 | 42 |
| Example 4 | 38 | 22 | 40 | 39 | 19 | 42 |
| Example 5 | 35 | 35 | 30 | 35 | 31 | 34 |
| Example 6 | 35 | 24 | 41 | 38 | 18 | 44 |
| Example 7 | 33 | 31 | 36 | 34 | 23 | 43 |
| Example 8 | 33 | 21 | 46 | 36 | 15 | 49 |
| Example 9 | 31 | 24 | 45 | 33 | 21 | 46 |
| Example 10 | 37 | 23 | 40 | 38 | 17 | 45 |
| Comparative Example 1 | (Au layer (Au: 100 at %)) | | | | | |
| Comparative Example 2 | (Au layer (Au: 100 at %)) | | | | | |
| Comparative Example 3 | none | | | | | |

TABLE 3

| | Second metal layer | | | | | |
|---|---|---|---|---|---|---|
| | AuSn eutectic phase | | | Au-rich phase (measurement point: b) | | |
| | Sn [at %] | Ni [at %] | Au [at %] | Sn [at %] | Ni [at %] | Au [at %] |
| Example 1 | 23 | 0 | 77 | 10 | 0 | 90 |
| Example 2 | 27 | 0 | 73 | 15 | 0 | 85 |
| Example 3 | 25 | 1 | 74 | 14 | 0 | 86 |
| Example 4 | 32 | 2 | 66 | 20 | 0 | 80 |
| Example 5 | 30 | 4 | 66 | 15 | 0 | 85 |
| Example 6 | 26 | 2 | 72 | 12 | 0 | 88 |
| Example 7 | 24 | 6 | 70 | 11 | 0 | 89 |
| Example 8 | 25 | 0 | 75 | 16 | 0 | 84 |
| Example 9 | 25 | 0 | 75 | 15 | 0 | 85 |
| Example 10 | 24 | 2 | 74 | 17 | 0 | 83 |
| Comparative Example 1 | 26 | 0 | 74 | 17 | 0 | 83 |
| Comparative Example 2 | 21 | 0 | 79 | 13 | 0 | 87 |
| Comparative Example 3 | 25 | 0 | 75 | 14 | 0 | 86 |

| | Second metal layer | | | | | | |
|---|---|---|---|---|---|---|---|
| | Sn-rich phase (measurement point: c) | | | Ni-segregated phase (measurement point: d) | | | |
| | Sn [at %] | Ni [at %] | Au [at %] | Sn [at %] | Ni [at %] | Au [at %] | Mode |
| Example 1 | 35 | 0 | 65 | No Ni-segregated phase | | | |
| Example 2 | 42 | 0 | 58 | No Ni-segregated phase | | | |
| Example 3 | 38 | 0 | 62 | 40 | 18 | 42 | A |
| Example 4 | 43 | 0 | 57 | 36 | 17 | 47 | A |
| Example 5 | 49 | 0 | 51 | 30 | 27 | 43 | B |
| Example 6 | 44 | 0 | 56 | 38 | 15 | 47 | A |
| Example 7 | 40 | 0 | 60 | 33 | 21 | 46 | B |
| Example 8 | 36 | 0 | 64 | No Ni-segregated phase | | | |
| Example 9 | 41 | 0 | 59 | No Ni-segregated phase | | | |
| Example 10 | 35 | 0 | 65 | 35 | 16 | 49 | B |
| Comparative Example 1 | 35 | 0 | 65 | No Ni-segregated phase | | | |
| Comparative Example 2 | 33 | 0 | 67 | No Ni-segregated phase | | | |
| Comparative Example 3 | 38 | 0 | 62 | No Ni-segregated phase | | | |

Structural Defects

According to the photographs of cross sections taken by the SEM, it was determined whether or not there was any crack at the interface between the AuSnNi alloy layer 13 and the AuSn eutectic layer 14 in the junction structure 10 in each of Examples 1 to 10. Similarly, it was determined whether or not there was any crack at the interface between the AuSn eutectic layer 14 and its adjacent layer (residual layer 19 or seed layer 17) in the junction structure 10 in each of Examples 1 to 10. As the following Table 4 illustrates, no crack was seen at any of the interfaces in the examples. No void was seen at any of the interfaces in the examples, either. That is, the junction structures 10 of Examples 1 to 10 were seen to have no structural defects.

As in the above-mentioned examples, it was determined whether or not there was any crack at the interface between the Au layer on the first substrate side and the AuSn eutectic layer in Comparative Example 1. It was also determined whether or not there was any crack at the interface between the AuSn eutectic layer and the Au layer on the second substrate side in Comparative Example 1. As the following Table 4 illustrates, the crack was seen to occur at the interface between the AuSn eutectic layer and the Au layer on the second substrate side in Comparative Example 1.

It was determined whether or not there was any crack at the interface between the Au layer on the first substrate side and the AuSn eutectic layer in Comparative Example 2. It was also determined whether or not there was any crack at the interface between the AuSn eutectic layer and the Au layer on the second substrate side in Comparative Example 2. As the following Table 4 illustrates, the crack was also seen to occur at the interface between the AuSn eutectic layer and the Au layer on the second substrate side in Comparative Example 2.

It was determined whether or not there was any crack at the interface between the Au layer on the first substrate side and the AuSn eutectic layer in Comparative Example 3. It was also determined whether or not there was any crack at the interface between the AuSn eutectic layer and the Au layer on the second substrate side in Comparative Example 3. As the following Table 4 illustrates, the crack was also seen to occur at the interface between the AuSn eutectic layer and the Au layer on the second substrate side in Comparative Example 3.

Bonding Strength Evaluation

The bonding strength (shear strength) of each junction structure was evaluated by the following method.

While a shearing force substantially parallel to the surface of the second substrate 60 was exerted on the second substrate joined to the first substrate 40 by the junction structure and increased, its value at the time when the junction structure was destroyed (the maximum strength of the junction structure) was measured. The fact that the shearing force is large at the time when the junction structure is destroyed means that the junction structure is excellent in bonding strength. For the bonding strength evaluation, a shear tester was used.

The mode of destruction (destruction mode) of each junction structure was studied. The following Table 4 lists the destruction mode of each junction structure. A, B, and C shown in Table 4 denote the following modes:

A: A mode in which the inside of the AuSn eutectic layer (14) is destroyed.

B: A mode in which the junction structure is destroyed at the interface between the first metal layer 11 and the AuSnNi alloy layer 13.

C: A mode in which the junction structure is destroyed at the interface between the AuSn eutectic layer and its adjacent layer (defect mode).

As the following Table 4 illustrates, the destruction mode was A or B in Examples 1 to 10. In Comparative Examples 1 to 3, on the other hand, the destruction mode was the defect mode C. That is, cracks were seen to occur in the AuSn eutectic layer and its adjacent gold layer in Comparative Examples 1 to 3. The shearing force at the time when the junction structure of each example was destroyed was also seen to be greater than that at the time when the junction structure of any of Comparative Examples 1 to 3 was destroyed.

Heat Resistance Evaluation

The heat evaluation of each junction structure was evaluated by the following method.

A heat cycle of raising temperature from −40° C. to 120° C. and then lowering it from 120° C. to −40° C. in an atmosphere where the junction structure was placed was repeated 1,000 times. The bonding strength of each junction structure after the 1,000 heat cycles was evaluated by the same method as mentioned above. The fact that the shearing force is large at the time when the junction structure is destroyed means that the junction structure is excellent in heat resistance.

The destruction mode of each junction structure after the above-mentioned heat cycles was studied. The following Table 4 lists the destruction mode of each junction structure. A+ shown in Table 4 denotes a mode in which the inside of the AuSn eutectic layer (14) was destroyed by a shearing force greater than that in the case of the destruction mode A.

As the following Table 4 illustrates, the destruction mode was A+, A, or B in Examples 1 to 10. In Comparative Examples 1 to 3, on the other hand, the destruction mode was the defect mode C. That is, cracks were seen to occur in the AuSn eutectic layer and its adjacent gold layer in Comparative Examples 1 to 3. The shearing force at the time when the junction structure of each example was destroyed was also seen to be greater than that at the time when the junction structure of any of Comparative Examples 1 to 3 was destroyed.

The difference in destruction mode between Example 8 and the other examples seems to result from the fact that the first metal layer 11 in the other examples is constituted by nickel containing phosphorus and thus is harder than that of Example 8 composed of nickel without phosphorus.

TABLE 4

| | Crack | Destruction mode | Destruction mode after heat cycles |
|---|---|---|---|
| Example 1 | no | A | A |
| Example 2 | no | A | A |
| Example 3 | no | A | A+ |
| Example 4 | no | A | A+ |
| Example 5 | no | A | A+ |
| Example 6 | no | A | A+ |
| Example 7 | no | A | A+ |
| Example 8 | no | B | B |
| Example 9 | no | A | A |
| Example 10 | no | A | A+ |
| Comparative Example 1 | yes | C | C |
| Comparative Example 2 | yes | C | C |
| Comparative Example 3 | yes | C | C |

INDUSTRIAL APPLICABILITY

The present invention can produce an electronic device equipped with a junction structure which is excellent in bonding strength and heat resistance.

REFERENCE SIGNS LIST

10 . . . junction structure; 11 . . . first metal layer; 12 . . . second metal layer; 13 . . . AuSnNi alloy layer; 14 . . . AuSn eutectic layer; 15 . . . conductor layer; 16, 17 . . . seed layer; 19 . . . residual layer; 21 . . . first precursor structure; 22 . . . second precursor structure; 23 . . . nickel layer; 24 . . . tin layer; 25 . . . gold layer; 40 . . . first substrate; 60 . . . second substrate; 90 . . . chip (electronic component); 100 . . . electronic device; a1, a2 . . . AuSnNi alloy phase; b . . . Au-rich phase; c . . . Sn-rich phase; d . . . Ni-segregated phase; s . . . AuSn eutectic phase

What is claimed is:

1. A junction structure for an electronic device comprising:
    a first metal layer containing nickel; and
    a second metal layer, formed on the first metal layer, containing gold, tin, and nickel;
    wherein:
        the second metal layer includes an AuSn eutectic phase, nickel is distributed unevenly in the AuSn eutectic phase, and tin is distributed lopsidedly about the nickel that is unevenly distributed in the AuSn eutectic phase; and
        a part of the second metal layer located on a first metal layer side of the second metal layer is an AuSnNi alloy layer including an AuSnNi alloy phase, the AuSnNi alloy phase abutting a surface of the first metal layer.

2. A junction structure for an electronic device according to claim 1, wherein the AuSn eutectic phase exists in a part of the second metal layer located on a side opposite from the first metal layer.

3. A junction structure for an electronic device according to claim 1, wherein the nickel concentration in the AuSnNi alloy layer decreases as the distance from the first metal layer increases.

4. A junction structure for an electronic device according to claim 1, wherein the nickel concentration in the first metal layer decreases as the distance from the second metal layer decreases.

5. An electronic device comprising the junction structure according to claim 1.

6. An electronic device comprising the junction structure according to claim 2.

7. An electronic device comprising the junction structure according to claim 3.

8. An electronic device comprising the junction structure according to claim 4.

9. A junction structure for an electronic device according to claim 1, further comprising a residual layer consisting of an Au phase or an AuSn alloy phase adjacent to the second metal layer.

10. A junction structure for an electronic device according to claim 1, further comprising a conductor layer onto which the first metal layer is formed, the conductor layer containing at least one element selected from the group consisting of gold, silver, copper, and aluminum.

11. A junction structure for an electronic device according to claim 1, wherein the first metal layer further contains phosphorus.

* * * * *